United States Patent [19]

Horowitz et al.

[11] Patent Number: 4,588,462

[45] Date of Patent: May 13, 1986

[54] METHOD AND APPARATUS FOR LAYING WIRE ARRAYS

[76] Inventors: Seymour M. Horowitz, 6525 Swainland Dr., Oakland, Calif. 94611; Dale D. Nesbitt, 1712 Marin Ave., Berkeley, Calif. 94707

[21] Appl. No.: 706,967

[22] Filed: Feb. 28, 1985

[51] Int. Cl.⁴ .......................................... B65H 81/00
[52] U.S. Cl. .................................... 156/177; 156/439
[58] Field of Search ............... 156/177, 178, 436, 439, 156/440, 291; 140/91.1; 28/101, 102; 29/605

[56] References Cited

U.S. PATENT DOCUMENTS

| | | | |
|---|---|---|---|
| Re. 26,374 | 4/1968 | Beery | 156/177 |
| 1,376,987 | 5/1921 | Wirt | 156/177 |
| 2,836,287 | 5/1958 | Cady | 203/150 |
| 2,962,080 | 11/1960 | Hirch | 156/177 |
| 3,010,007 | 11/1961 | Theodore et al. | 156/177 |
| 3,185,184 | 5/1965 | Loy et al. | 140/71 |
| 3,298,403 | 1/1967 | Allers | 140/92.1 |
| 3,574,927 | 4/1971 | Whetstone | 29/592 |
| 3,964,959 | 6/1976 | Adams | 156/177 |
| 4,347,873 | 9/1982 | Caras | 140/92.1 |

Primary Examiner—Michael Ball

[57] ABSTRACT

Wire arrays (11) having a continuous wire (12) which is formed into a predetermined pattern and adhered to a backing material or substrate (13) are fabricated by applying adhesive material (16a, 16b) along opposite edge portions (17, 18) of the substrate, positioning a row of winding spools (21) along each of the edge portions and repeatedly extending the wire between and around successive spools at the opposite edge portions. The wound wire is then traveled along each spool toward the substrate and into contact with the adhesive. The spools are then removed and a coating of hardenable material (54) is applied to secure the wound wire to the substrate. Tension in the wire is relieved prior to contact of the wire with the adhesive and a small amount of slack is introduced into the wire before the final coating step. Mechanism (32) is provided for lifting the spools away from the substrate without disturbing the wound wire. The method and apparatus enable manufacture of precisely configured wire arrays without complex or costly equipment and do not require structural alterations in the substrate for the purpose of accommodating to fabrication equipment.

22 Claims, 3 Drawing Figures

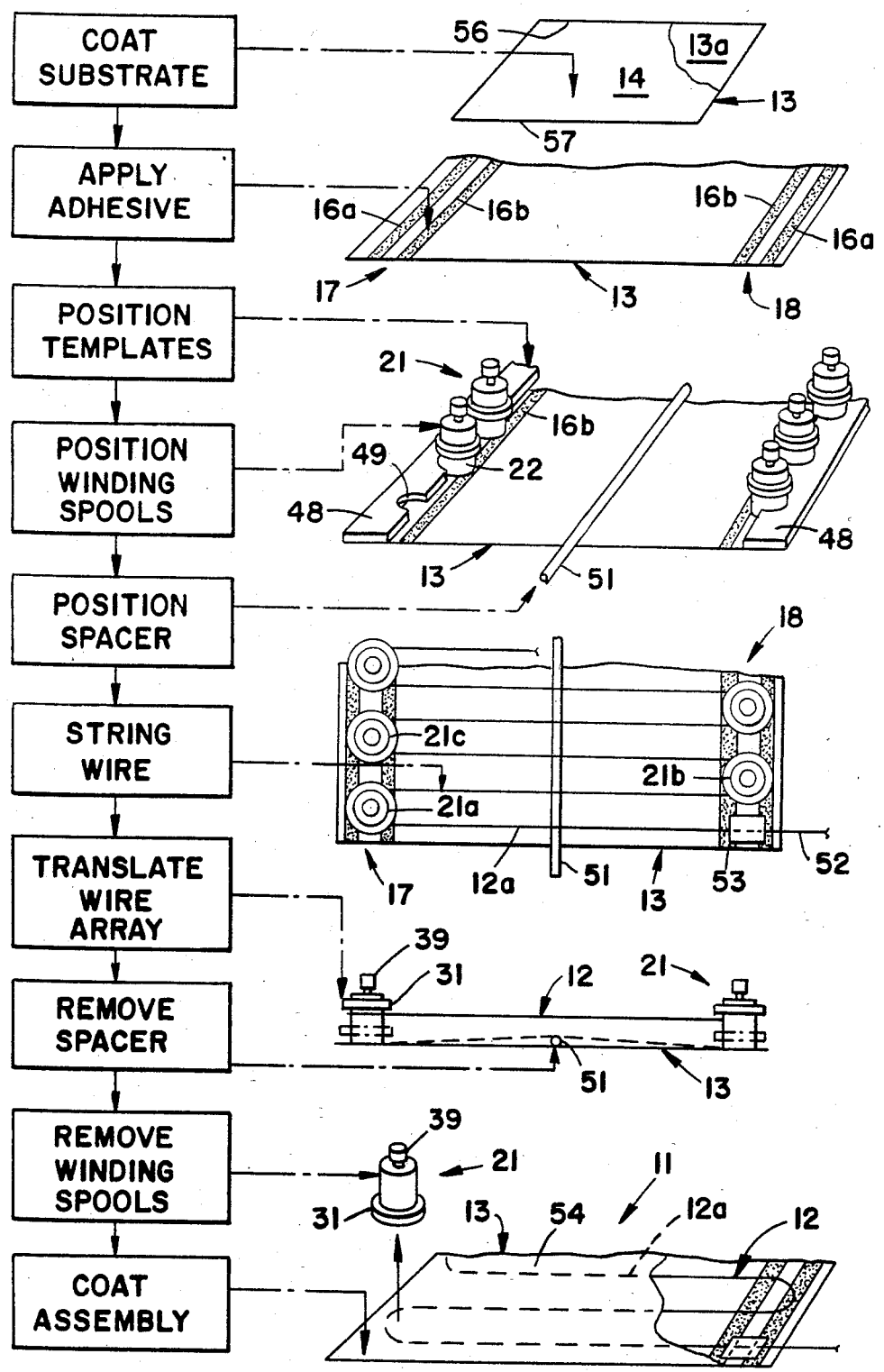
FIG_1

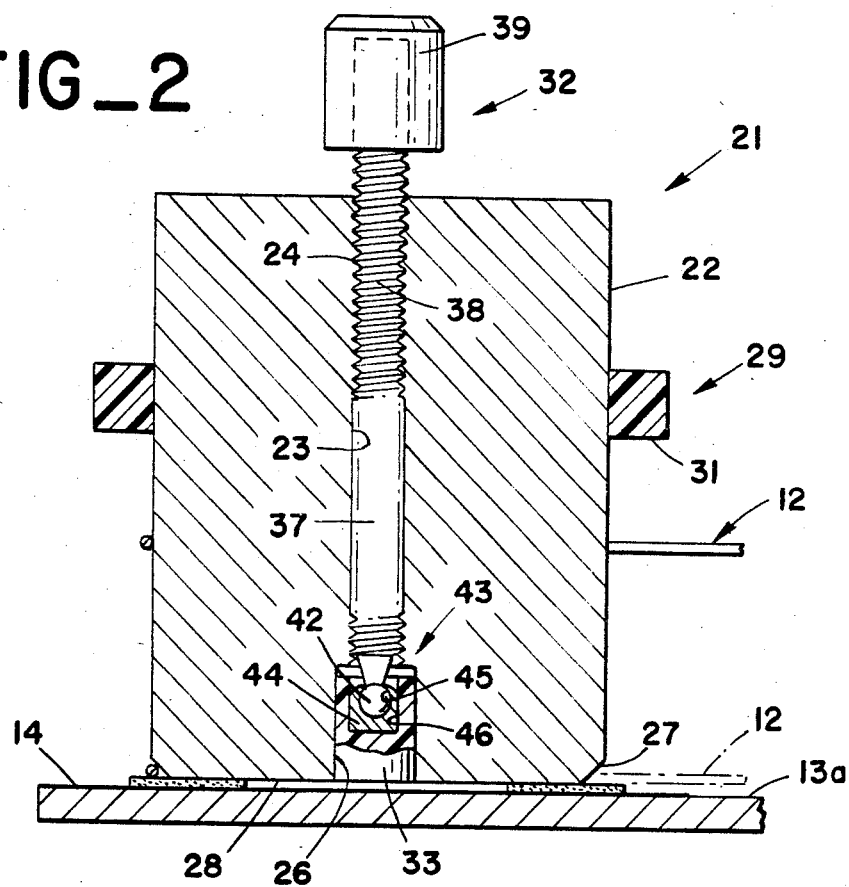
FIG_2
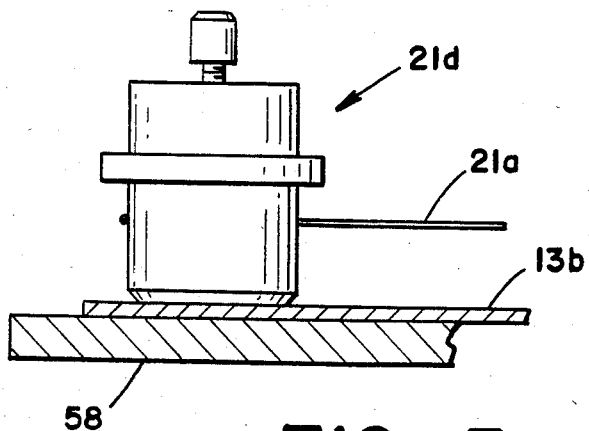
FIG_3

METHOD AND APPARATUS FOR LAYING WIRE ARRAYS

TECHNICAL FIELD

The present invention relates to the manufacture of wire arrays for use in electrical circuits or the like. More particularly, the invention relates to a method and apparatus for fabricating wire arrays of the type in which a continuous wire is formed into a predetermined pattern and adhered to the surface of a backing material.

BACKGROUND OF THE INVENTION

Certain electrical systems require that conductive wire be formed into a predetermined pattern and be adhered to a backing material or substrate for support or for other purposes. Successive portions of the wire typically extend in parallel, spaced apart relationship although other wire configurations may be needed in some instances.

As a specific example, apparatus for studying heat transfer through building wall materials may include a wire array formed of a conductor such as nickel which has an electrical resisivity that varies as a function of temperature. The array is disposed against the wall material and functions electrically as a component of a bridge circuit for detecting heat. Wire arrays of this general type may also be used in other apparatus such as in strain gages or antennas among other examples.

Fabrication of wire arrays has heretofore been undesirably complicated and costly, particularly if the wire must have a precise predetermined configuration. Fixtures, winding frames and the like as heretofore designed for the purpose tend to be bulky, complex and expensive. Many such devices are limited to the forming of wire arrays or grids of the particular type having a series of separate lengths of wire disposed in parallel relationship. Some usages, such as the above discussed apparatus for studying heat transfer in wall materials, require that at least sizable portions of the array be formed with a continuous wire.

Other known fixtures provide spaced apart rows of pins between which a continuous wire can be wound to form an array but do not enable the portions of the wire in the vicinity of the pins to be adhered to the backing material.

Many prior techniques and devices for forming a continuous wire into an array tend to introduce some degree of tension into the wire. This can be highly undesirable in certain usages of which the above mentioned apparatus for studying thermal characteristics of wall materials is again an example. Such tension can alter the electrical parameters of the wire in a manner which detracts from the accuracy of the measurement. In such applications it would be desirable to provide for a slight controlled amount of slack in the wire as it is adhered to the backing material.

Some prior fabrication procedures require that openings be formed in the backing material or substrate to receive pins or the like around which the wire is strung. Openings or other deformations of the backing material are also undesirable in certain usages of wire arrays such as in the specific usage discussed above.

The present invention is directed to overcoming one or more of the problems discussed above.

SUMMARY OF THE INVENTION

In one aspect, the present invention provides a method of forming a wire array in which wire that is wound into a predetermined pattern is adhered to a surface of a substrate material. The method includes the steps of disposing adhesive on the surface at least along two opposite edge portions of the surface, positioning a first pluality of removable winding spools along the first portion in spaced apart relationship and positioning a second plurality of removable winding spools along the second of the edge portions in spaced apart relationship. A continuous wire is wound around the spools in a configuration in which successive portions of the wire extend between spools at opposite edge portions in spaced apart relationship from the substrate surface. The wire is then traveled along the spools towards the surface and into contact with the adhesive. The winding spools are removed and a coating of hardenable material is applied to the surface.

In a more specific aspect, the method of the present invention provides for fabricating a wire array having a continuous wire formed into a predetermined pattern and secured to the surface of a backing material which includes the steps of applying adhesive material to the surface at least at first and second spaced apart portions of the surface and disposing a row of spaced apart winding spools at each of the first and second portions of the surface. A template is used to establish predetermined positions for each of the spools and a spacer element placed on the surface between the first and second portions. The wire is wound around each of the spools with successive portions of the wire being extended between spools at the first and second portions of the surface and with the wire initially being maintained spaced apart from the surface. The wire is then traveled along the spools towards the surface and into contact with the adhesive to adhere the portions of the wire which are adjacent the spools to the surface and to bring other portions of the wire into contact with the spacer element. Tension in the wire is relaxed as it approaches the adhesive. The spools are then removed and the spacer element is withdrawn from between the wire and the surface to introduce slack into the wire. A coating of hardenable material is applied to the surface including the wire to secure the wire to the backing material.

In another aspect, the invention provides apparatus for fabricating a wire array of the type having wire arranged in a predetermined pattern and adhered to a surface of a sheet of backing material. Components of the apparatus include adhesive material disposed on the surface at least at first and second portions of the surface, a first plurality of spaced apart winding spools supported on the surface at the first portion and a second plurality of winding spools disposed on the surface at the second portion, the winding spools having bodies against which turns of the wire may be wound, and means for sliding the turns of wire along the spool bodies towards the surface and into contact with the adhesive.

In a more specific aspect of the invention, apparatus for forming a wire array in which a continuous wire is secured to the surface of a substrate material includes a first plurality of cylindrical winding spool bodies disposed in spaced apart relationship along a first portion of the substrate sheet and a second plurality of cylindrical winding spool bodies disposed along the second portion of the sheet. Each of the winding spool bodies has an upper region around which a turn of the wire may be wound and has a chamfered base of smaller diameter than the upper region and also has an interior chamber extending upwardly from the base. Further elements of the apparatus include adhesive material on the substrate sheet adjacent the base of each winding spool body and a plurality of annular elements each being disposed on a separate one of the spool bodies in coaxial relationship with the spool body and being slidable along the spool body to urge turns of wire towards the adhesive material. One of a plurality of plungers is disposed within the chamber of each spool body and means are provided for urging the plungers outwardly from the chambers to lift the spool bodies away from the substrate sheet.

In still another aspect, the invention provides a winding spool for facilitating fabrication of wire arrays. The winding spool includes a body member around which a turn of wire may be wound, the body member having a first end surface of reduced diameter, an interior chamber extending inward from the first end surface and an interior passage extending from the chamber to the opposite end of the body member. The winding spool further includes an annular element encircling and contacting the body member and being slidable along the body member to urge the turn of wire towards the first end surface. A plunger is disposed in the chamber and is slidable between a first position at which it is retracted into the chamber and a second position at which it protrudes outwardly from the first end surface of the body member. A shaft extends within the passage and has an end coupled to the plunger and means are provided at the opposite end of the body member for actuating the shaft to translate the plunger from the first position to the second position.

The invention enables rapid and economical manufacture of wire arrays without the use of complex or costly fabrication equipment. Arrays formed of a single continuous wire may be fabricated and the wound wire can be adhered to a substrate or backing material in an untensioned condition and with a controlled amount of slack if desired. The invention does not require openings or other structural adaptations in the backing material for the purpose of accommodating to fabrication fixtures.

BRIEF DESCRIPTION OF THE DRAWINGS

FIG. 1 diagrammatically illustrates steps in the practice of one embodiment of the invention and depicts apparatus which may be used in the practice of the method.

FIG. 2 is an axial section view of a winding spool used in the practice of the method of FIG. 1.

FIG. 3 is an elevation view of a modication of certain components of the apparatus of the invention.

DETAILED DESCRIPTION OF PREFERRED EMBODIMENTS

Referring initially to FIG. 1 of the drawings, the product of the depicted embodiment of the invention is a wire array 11 of the hereinbefore discussed type which has a continuous wire 12 adhered to a backing material or substrate 13. The substrate 13 in this particular example is a rectangular sheet of aluminum but other materials and other configurations may also be employed depending on the particular usage which is to be made of the wire array 11.

Wire 12 in this example is wound into a predetermined pattern in which successive portions of the wire form a series of spaced apart parallel strands 12a that extend across the surface 13a of substrate 13. As will become apparent, the wire 11 can also be wound in a variety of other patterns including patterns in which groups of the strands 12a intersect to form a gridwork.

Considering now the method and apparatus for fabricating the wire array 11, it may be desirable in many instances to coat the surface 13a of substrate 13 with a layer 14 of electrically insulative material which aderes to the surface upon being cured, polyvinylchloride plastic being one suitable example. Layer 14 may be not be necessary in some instances such as where the substrate 13 is itself non-conductive or the wire 12 is provided with adequate insulation. Wire 12 is in fact coated with insulation in this example but an insulative layer 14 is preferably also provided to assure against an electrical short circuit.

Subsequent to the above described coating step, if any, at least one strip of adhesive material 16a is laid along opposite edge portions 17 and 18 of the substrate surface 13a to retain the wound wire 12 in position at a subsequent stage of the operations as will hereinafter be described in more detail. In the present example a spaced apart pair of such strips 16a and 16b is laid along each such edge portion 17 and 18 to enhance such retention of the wire but this is not necessary in all instances.

The adhesive strips 16a, 16b in this specific example are formed by laying strips of tape along edge portions 17 and 18, the tape being of the known form having an adhesive material on both surfaces of a type which does not harden rapidly. Strips 16a, 16b may also be formed by applying an adhesive mixture that does not contain tape to edge portions 17 and 18 of the substrate 13.

A first plurality of winding spools 21 are disposed in spaced apart relationship along first edge portion 17 preferably directly over the adhesive strips 16a, 16b at that edge portion and a second plurality of the winding spools are disposed along the other edge portion 18 in spaced apart relationship and preferably over both adhesive strips 16a, 16b at that edge portion.

Referring now to FIG. 2, each winding spool 21 in this example has a cylindrical body 22 around which the wire 12 may be wound as will hereinafter be described in more detail. An axial passage 23 in body 22 has an upper portion provided with internal threads 24 and a lower portion which communicates with a cylindrical plunger chamber 26 that extends upwardly from the flat lower end surface 28 of the spool body. A chamfer 27 at the base of spool body 22 causes the lower end surface 28 to be of smaller diameter than the rest of the spool body.

Spool 21 is further provided with means 29 for traveling wire 12 along the spool towards the surface 14a of substrate 13 and into contact with adhesive strips 16a, 16b. In particular, an annular element 31 is fitted onto spool 21 in coaxial, contacting relationship with the spool body 22, the annular element being slidable along the spool body to urge wire 12 downwardly.

Spool 21 also includes means 32 for lifting body 22 away from substrate 13 with an initial movement that is precisely directly outward. This avoids slight cantings or sideward displacements of the body 22 that could otherwise disturb the position of wire 12 after it has been adhered to strips 16a, 16b or which could disrupt the adhesive or damage insulative layer 14.

In this example, such means 32 includes a cylindrical plunger 33 in chamber 26 which is slidable from a retracted position within the chamber 26 to a second position at which the plunger protrudes downwardly from the undersurface 28 of spool body 22.

Plunger 33 is selectively extendable from the retracted position to the second or protruding position by rotation of a shaft 37 which extends into passage 23 of the spool body 22 and which has external threads 38 engaging passage threads 24 so that the shaft moves axially upon being rotated. A knob 39 is secured to the top of shaft 37 above spool body 22 to facilitate such rotation.

The lower end of shaft 37 is coupled to plunger 33 within chamber 26 by swivel means 43 which in this example includes a ball element 42 formed on the lower end of shaft 37 which is engaged by a cylindrical element 44 having a spherical cavity 45 in which the ball element 42 is received. The cylindrical element 44 is friction fitted into a conforming cavity 46 in the upper end of plunger 33.

Knob 39 is rotated, when spool 21 is to be lifted away from substrate 13, causing plunger 33 to bear against the substrate while the spool body moves away from the substrate with a strictly perpendicularly directed motion. If necessary, body 22 may be manually restrained against rotation during this operation although in many cases inertia, assisted initially by adhesion to strips 16a and 16b, accomplishes the same effect. Spool 21 may simply be lifted away after body 22 has been raised above the wire 12 which adheres to strips 16a and 16b.

Referring again to FIG. 1, the bodies of spools 21 have a diameter corresponding to the desired spacing of the strands 12a of wire in the wire array 11. Spool bodies are spaced apart along each edge portion 17 and 18 of substrate 13 a distance corresponding to that diameter if the strands 12a are to be uniformly spaced apart. Ones of the spools 21 along edge portion 18 of substrate 13 are placed in positions corresponding to the gaps between the spools which are located along the other edge portion 17.

Spools 21 are retained in place during the wire 12 winding operation by the frictional force created by the weight of the spools which frictional force is enhanced by adhesion to strips 16a and 16b where the spools are disposed directly over such strips as in the present embodiment. Each spool 21 has sufficient weight to resist the small amount of sideward force which is exerted on the spool when wire 12 is wound around the spool and extended to a spool at the other side of the substrate 13. While the diameter of the spool bodies 22 is determined by the other considerations discussed above, the height and material of the spool bodies can be selected to provide the desired amount of weight. The bodies 22 in this example are solid brass but if necessary in order to provide adequate weight without undesirable height the bodies may be a shell of brass or steel for example that is filled with a heavier metal such as lead.

Returning to the steps which may be performed in the practice of the method of the invention, a preferred technique for positioning the winding spools 21 makes use of positioning templates 48. A pair of templates 48 are used in this embodiment, each being a flat linear element which is temporarily disposed along a separate one of the edge portions 17 and 18 of substrate 13 in register with the adjacent edge of the substrate. Each template 48 has a series of semicircular notches 49 along the inner edge, the notches having a diameter similar to that of spool bodies 22 and being located at the positions which are to be occupied by the spools 21 during winding of wire 12.

A spool 21 is fitted into each of the notches 49 and the positioning templates 48 are then removed. A spacer rod 51 is then laid along the center of substrate 13 in parallel relationship to the rows of spools 21 to provide for a desired amount of slack in wire 12 upon completion of the wire array 11 as will hereinafter be described in more detail.

One end portion 52 of wire 12 is then secured to a corner of substrate 13 in position to define the first strand 12a of the wire array. Wire end portion 52 protrudes a small distance from the edge of substrate 13 to provide for electrical connections and is fastened to the substrate by a piece of adhesive tape 53 in this example although a terminal may be mounted on the substrate for similar purposes in some instances.

Wire 12 is then wound around the first spool 21a at the edge portion 17 of substrate 13 opposite from wire end 52 and extended back to the first spool 21b at the other edge portion 18. The wire 12 is then turned around spool 21b and extended to the next spool 21c at edge portion 17 after which additional ones of the strands 12a are formed in the same manner by alternately winding the wire around successive spools at opposite edge portions 17 and 18.

Wire 12 is maintained a distance above the surface of substrate 13 and above spacer rod 51 during the above described winding operation. A slight amount of tension is maintained in the wire 12 during the winding step so that the wire temporarily remains in this spaced apart relationship to substrate 13 because of frictional forces where the wire turns around the spools 21. Upon completion of the winding operation, the other end (not shown) of the wire 12 may be fastened to substrate 13 with another piece of tape 53 in the manner described above with respect to wire end portion 52.

The wound wire 12 is then traveled downward towards the surface of substrate 13 by sliding the rings 31 at each spool 21 downwardly. The portions of the wire 12 which turn around spools 21 are forced into contact with adhesive strips 16a, 16b and are thereby adhered to substrate 13. As is more apparent in FIG. 2, tension in wire 12 is relieved just prior to adherence of the wire to strips 16a, 16b when the wire enters chamfer 27 at the base of the spool body 22.

Returning to FIG. 1, a limited amount of slack is created in the strands 12a of wire 12 by withdrawing spacer rod 51 from between the strands and substrate 13. The slack, which is controlled by selection of the thickness of spacer rod 51, is advantageous in most instances as it avoids alteration of the electrical properties of wire 12 that might otherwise occur from flexing or thermally induced dimensional changes in substrate 13.

Following adherence of the wound wire 12 to adhesive strips 16a, 16b, spools 21 are withdrawn from the substrate 13. The initial stage in the removal of each spool 21 is accomplished by turning knob 39 to lift the spool body 22 away from the substrate 13 in a precisely outward direction as previously described. Manual pressure may be applied to the spool ring 31 at this stage to hold wire 12 in place. The spool 21 is then lifted away after the spool body 22 has separated from strips 16a, 16b and has been raised above wire 12 by turning of knob 39.

Assembly of the wire array 11 may then be completed by applying another coating 54 of a hardenable but initially semi-liquid material to the surface of substrate 13 in order to secure all portions of the wound wire 12 to the substrate and to provide a protective layer over the wire. The final coating 54 material is preferably an electrically insulative one which cures into a somewhat elastic solid, silicone rubber being a suitable example.

The method and apparatus may be used to form wire grids of the type having intersecting orthogonal strands by positioning spools 21 and additional adhesive strips 16a, 16b along the other two opposite edges 56 and 57 of substrate 13 and repeating the above described steps. Edge portions 17 and 18 may be cut away from the remainder of the assembly 11 in instances where it is desired to provide a grid of the form having strands 12a which are electrically isolated from each other.

The above described method and apparatus does not necessarily require that there be any openings or other structural deformations in the substrate 13 for the purpose of maintaining winding spools 21 in place during the winding operation. The weight of the spools 21 assisted in this example by temporary adhesion to strips 16a, 16b creates sufficient frictional force for the purpose. Preferably the spools 21 are made sufficiently heavy that wire 12 breakage will occur before a spool is displaced if an overly strong pulling force should be exerted on the wire during the winding operation. This prevents manufacture of a wire array 11 having a wire 12 configuration which differs from the predetermined desired pattern. In some instances, such as where wire strands 12a must be closely spaced or if it is necessary to use thick high strength wire 12, it may not be practical to make the spools 21 sufficiently heavy for this purpose. Other techniques such as that depicted in FIG. 3 may then be employed to increase the frictional forces which hold the spools 21 in place without requiring structural alteration of substrate 13 for the purpose.

In the embodiment of FIG. 3, the method and apparatus may be similar to what has been previously described except insofar as the bodies 22a of spools 21d are partally or wholly formed of a magnetized material such as alnico or magnetized steel. Ferromagnetic material 58 is disposed beneath the substrate 13, at least in the vicinity of each spool 21d during the winding operation. Magnetic attraction between the spools 21 and material 58 then substantially increases the frictional forces acting to resist displacement of the spools. A similar result can be accomplished if material 58 is itself magnetized and spool bodies 22a are formed at least in part of ferromagnetic material such as steel.

While the invention has been described with respect to certain specific embodiments, many variations are possible and it is not intended to limit the invention except as defined in the following claims.

We claim:

1. In a method of forming a wire array in which wire is adhered to a surface of a substrate material in a predetermined pattern thereon, the steps comprising:

disposing adhesive on said surface at least along each of two opposite edge portions thereof, positioning a first plurality of removable winding spools along a first of said edge portions of said surface in spaced apart relationship therealong and positioning a second plurality of removable winding spools along the second of said edge portions of said surface in spaced apart relationship therealong, winding a continuous wire around said spools in a configuration wherein successive portions of said wire extend between spools at opposite edges of said surface in spaced apart relationship from said surface, traveling said wire along said spools towards said surface and into contact with said adhesive, removing said winding spools from said surface of said substrate, and applying a coating of hardenable material to said surface of said substrate.

2. The method of claim 1 wherein said wire is maintained in tension during said winding step and including the further step of establishing a degree of frictional resistance to movement of said spools along said surface that is sufficient to prevent displacement of said spools during said winding step.

3. The method of claim 2 including utilizing spools of sufficient weight to establish said degree of frictional resistance.

4. The method of claim 1 including the further step of disposing additional material on the opposite side of said substrate material and retaining said spools in place during said winding step by establishing magnetic attraction between said spools and said additional material.

5. The method of claim 1 wherein said wire is maintained in tension during said winding step and including the further step of relaxing said tension as said wire is being traveled into contact with said adhesive.

6. The method of claim 1 including the further step of establishing a controlled amount of slack in said successive portions of said wire prior to said application of said coating of hardenable material to said surface of said substrate.

7. The method of claim 1 including the further step of applying a precoating of material to said surface prior to said winding step.

8. The method of claim 1 including the further step of disposing templates at said first and second edge portions of said surface to define predetermined positions for said spools.

9. The method of claim 1 including the further steps of forming at least two spaced apart strips of said adhesive along each of said opposite edge portions of said surface, and positioning said spools at locations which straddle said spaced apart strips of said adhesive.

10. The method of claim 1 including the further steps of lifting each of said spools precisely directly outward from said surface during at least the initial portion of said removal of said spools from said surface, and exerting pressure against said wire in the vicinity of each of said spools during said initial portion of said removal of said spools from said surface.

11. A method of fabricating a wire array which has a continuous wire formed into a predetermined pattern that is secured to a surface of a backing material comprising the steps of:

applying adhesive material to said surface at least at each of first and second spaced apart portions thereof, disposing a row of spaced apart winding spools at each of said spaced apart portions of said surface including utilizing a template to establish predetermined positions for each of said spools on said surface, disposing a spacer element on said surface between said first and second portions thereof, winding said wire around each of said spools including extending successive portions of said wire between spools at said first and second spaced apart portions of said surface while initially maintaining said wire spaced apart from said surface, traveling said wire along said spools towards said surface and into contact with said adhesive material to adhere the portions of said wire adjacent said spools to said surface and to bring other portions of said wire into contact with said spacer element, including relaxing tension in said wire as it approaches said adhesive material, removing said spools from said surface and withdrawing said spacer element from between said wire and said surface to introduce slack into said wire, and applying a coating of a hardenable material to said surface including said wire to secure said wire thereto in said predetermined pattern thereon.

12. Apparatus for fabricating a wire array which has wire arranged in a predetermined pattern and adhered to a surface of a sheet of backing material, comprising:

adhesive material disposed on said surface at least at first and second spaced apart portions thereof, a first plurality of spaced apart winding spools disposed on said surface and supported thereby at said first portion thereof, and a second plurality of spaced apart winding spools disposed on said surface and supported thereby at said second portion thereof, said winding spools having bodies against which turns of said wire may be wound, and means for sliding said turns of wire along said spool bodies towards said surface and into contact with said adhesive material.

13. The apparatus of claim 12 wherein said means for sliding said turns of wire along said spool bodies includes a plurality of annular elements each extending around a separate one of said spool bodies in contacting relationship therewith and being slidable along said one of said spool bodies in an axial direction.

14. The apparatus of claim 12 wherein each of said winding spool bodies has an upper region for receiving said turns of wire and a lower end region facing said surface which is of smaller diameter than said upper region.

15. The apparatus of claim 12 wherein each of said winding spool bodies has a lower end which faces said surface and has an opening at said lower end defining a chamber therein, further including a slidable plunger disposed in said chamber, and means for selectively extending said plunger downward from said chamber to lift the spool body away from said surface.

16. The apparatus of claim 15 wherein each of said winding spool bodies has an undersurface at said lower end thereof which is flat and parallel to said surface of said backing material, and wherein said plunger of each of said winding spools has a flat bottom surface which is also parallel to said surface of said backing material.

17. The apparatus of claim 15 wherein said winding spool body has a vertical central passage communicating with said chamber, and wherein said means for selectively extending said plunger downward from said chamber includes a rotatable shaft extending along said passage and having a threaded engagement with said winding spool body within said passage to cause axial movement of said shaft relative to said winding spool body upon rotation of said shaft, further including swivel means for transmitting said axial movement of said shaft to said plunger without requiring rotation of said plunger.

18. The apparatus of claim 12 wherein said first and second pluralities of winding spools define parallel rows of winding spools along opposite edge portions of said surface of said backing material, further including a linear spacer element extending along said surface between said rows in parallel relationship therewith.

19. The apparatus of claim 12 wherein a first pair of spaced apart strips of said adhesive material extend along a first edge portion of said surface of said sheet of backing material and a second pair of spaced apart strips of said adhesive material extend along an opposite edge portion of said surface, each of said first plurality of winding spools being positioned to straddle said first pair of strips in contact with each thereof and each of said second plurality of winding spools being positioned to straddle said second pair of strips in contact with each thereof.

20. The apparatus of claim 12 further including at least one removable template disposed on said surface of said backing material and having a plurality of spaced apart notches into which said winding spools are fitted, each of said notches being located along said template to define a predetermined position for a separate one of said winding spools on said surface.

21. Apparatus for forming a wire array in which a continuous wire winding is secured to the surface of a sheet of substrate material, comprising:

a first plurality of cylindrical winding spool bodies disposed in spaced apart relationship along a first portion of said sheet of substrate material and a second plurality of cylindrical winding spool bodies disposed in spaced apart relationship along a second portion of said sheet of substrate material, each of said winding spool bodies having an upper region around which a turn of said wire may be wound and having a chamfered base of smaller diameter than said upper region and further having an interior chamber extending upwardly from said base, adhesive material disposed on said sheet of substrate material adjacent said base of each of said winding spool bodies, a plurality of annular elements, each being disposed on a separate one of said winding spool bodies in coaxial relationship therewith and being slidable therealong to urge said turns of wire towards said adhesive material, a plurality of plunger elements, each being disposed within said chamber of a separate one of said winding spool bodies, and means for urging said plungers outwardly from said chambers at said bases of said winding spool bodies to lift said winding spool bodies away from said sheet of substrate material.

22. A winding spool for facilitating fabrication of wire arrays comprising:

a body member around which a turn of wire may be wound, said body member having a first end surface of reduced diameter relative to the region of said body member around which said wire is wound and having an interior chamber extending inward from said first end surface and further having an interior passage extending from said chamber to the opposite end of said body member, an annular element encircling said body member in contact therewith and being slidable therealong to urge said turn of wire towards said first end surface, a plunger disposed in said chamber and being slidable between a first position at which the plunger is retracted into said chamber and a second position at which the plunger protrudes outwardly from said first end surface of said body member, a shaft extending within said passage and having an end coupled to said plunger, and means at said opposite end of said body member for actuating said shaft to translate said plunger from said first position thereof to said second position thereof.

* * * * *